(12) United States Patent
Lee et al.

(10) Patent No.: US 11,034,108 B2
(45) Date of Patent: Jun. 15, 2021

(54) IMPRINTING METHOD

(71) Applicant: HIMAX TECHNOLOGIES LIMITED, Tainan (TW)

(72) Inventors: Chin-Der Lee, Tainan (TW); Han-Yi Kuo, Tainan (TW); Jui-Pin Tsai, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 0 days.

(21) Appl. No.: 16/711,289

(22) Filed: Dec. 11, 2019

(65) Prior Publication Data

US 2020/0114602 A1    Apr. 16, 2020

Related U.S. Application Data

(62) Division of application No. 15/222,808, filed on Jul. 28, 2016, now Pat. No. 10,549,494.

(60) Provisional application No. 62/324,885, filed on Apr. 20, 2016.

(51) Int. Cl.
| | |
|---|---|
| *B29D 11/00* | (2006.01) |
| *G03F 7/00* | (2006.01) |
| *B29C 59/04* | (2006.01) |
| *B29C 31/00* | (2006.01) |
| *B29C 33/30* | (2006.01) |
| *B29C 59/02* | (2006.01) |
| *B29C 35/08* | (2006.01) |
| *B29C 37/00* | (2006.01) |
| *B29L 11/00* | (2006.01) |
| *B29K 105/24* | (2006.01) |

(52) U.S. Cl.
CPC ...... *B29D 11/00865* (2013.01); *B29C 31/008* (2013.01); *B29C 33/306* (2013.01); *B29C 59/046* (2013.01); *B29D 11/00769* (2013.01); *B29D 11/00951* (2013.01); *G03F 7/0002* (2013.01); *B29C 35/0805* (2013.01); *B29C 59/026* (2013.01); *B29C 2035/0827* (2013.01); *B29C 2037/90* (2013.01); *B29C 2059/023* (2013.01); *B29K 2105/24* (2013.01); *B29K 2105/243* (2013.01); *B29L 2011/00* (2013.01)

(58) Field of Classification Search
CPC ........... B29C 2059/023; B29C 31/008; B29C 33/306; B29C 59/002; B29C 59/02; B29C 59/026; B29C 59/04; B29C 59/046
USPC ....................................................... 425/174.4
See application file for complete search history.

(56) References Cited

U.S. PATENT DOCUMENTS

| | | | |
|---|---|---|---|
| 2013/0011507 A1* | 1/2013 | Itani ...................... | B29C 31/006 425/150 |
| 2013/0224963 A1* | 8/2013 | Hatano ............... | H01L 21/6715 438/758 |
| 2015/0111005 A1* | 4/2015 | Hosomi ................ | B29C 59/022 428/174 |

(Continued)

*Primary Examiner* — Matthew J Daniels
*Assistant Examiner* — Yunju Kim
(74) *Attorney, Agent, or Firm* — JCIPRNET (57) ABSTRACT

An imprinting method, which includes following steps. A workpiece is conveyed to a working region by a first conveyer unit. The workpiece is imprinted in the working region through an imprinting segment of a flexible imprinting mold film. The flexible imprinting mold film is driven by a driving roller set, such that at least another one of the imprinting segments of the flexible imprinting mold film rolled around the driving roller set is expanded from the driving roller set and moved to the working region.

13 Claims, 11 Drawing Sheets

(56) References Cited

U.S. PATENT DOCUMENTS

2015/0158323 A1* 6/2015 Richert .................. B41F 17/00
283/85
2017/0153554 A1* 6/2017 Hinnen ............... G03F 7/70625

* cited by examiner

IMPRINTING METHOD

CROSS-REFERENCE TO RELATED APPLICATION

This application is a divisional application of and claims the priority benefit of U.S. application Ser. No. 15/222,808, filed on Jul. 28, 2016, now allowed, which claims the priority benefits of U.S. provisional application Ser. No. 62/324,885, filed on Apr. 20, 2016. The entirety of each of the above-mentioned patent applications is hereby incorporated by reference herein and made a part of this specification.

BACKGROUND OF THE INVENTION

Field of the Invention

The invention relates to an imprinting method, and particularly relates to an imprinting method using a flexible imprinting mold film to implement imprinting.

Description of Related Art

A commonly used imprinting technique is to first evenly coating an imprinting material on a substrate, and then an imprinting mold is pressed on the imprinting material layer on the substrate to transfer an imprinting pattern on the surface of the imprinting mold onto the imprinting material layer. For example, the imprinting technique can be used for manufacturing optical elements having an optical grating, where imprinting microstructures on the imprinting mold are used to imprint an optical layer on the transparent substrate, and the imprinted optical layer is then cured to form the optical grating on the transparent substrate.

Generally, the imprinting microstructures of the imprinting mold will be gradually worn and need to be replaced after multiple imprinting operations, and a user has to remove the original imprinting mold from the imprinting apparatus, and installs a new imprinting mold on the imprinting apparatus, and such replacement process is labor and time-consuming to result in inconvenience and low productivity of the imprinting apparatus in use.

SUMMARY OF THE INVENTION

The invention is directed to an imprinting method, by which usage convenience of an imprinting apparatus is improved.

The invention provides an imprinting method, which includes following steps. A workpiece is conveyed to a working region by a first conveyer unit. The workpiece is imprinted in the working region through an imprinting segment of a flexible imprinting mold film. The flexible imprinting mold film is driven by a driving roller set, such that at least another one of the imprinting segments of the flexible imprinting mold film rolled around the driving roller set is expanded from the driving roller set and moved to the working region.

In an embodiment of the invention, the imprinting method further includes coating an optical layer on the workpiece by an coating unit before the workpiece reaches the working region, where the step of imprinting the workpiece through the imprinting segment includes imprinting the optical layer through an imprinting microstructure of the imprinting segment to form an optical microstructure on the workpiece.

In an embodiment of the invention, the imprinting method further includes detecting a surface state of the workpiece uncoated with the optical layer through a first detection unit.

In an embodiment of the invention, the imprinting method further includes curing the imprinted optical layer through energy provided by an energy source.

In an embodiment of the invention, the imprinting method further includes following steps. The optical layer before imprinted is half-cured through energy provided by a first energy source, and the imprinted optical layer is completely cured through energy provided by a second energy source.

In an embodiment of the invention, the imprinting method further includes pressing the corresponding imprinting segment to the workpiece through an imprinting mold roller.

In an embodiment of the invention, the imprinting method further includes driving the workpiece to move up and down relative to the flexible imprinting mold film through a lifting unit.

In an embodiment of the invention, the working region includes an imprinting position and at least one mold-release position, and the imprinting method further includes following steps. At least two of the imprinting segments are made to be respectively located at the imprinting position and the mold-release position. The workpiece is imprinted at the imprinting position. The imprinted workpiece is adhered to the corresponding imprinting segment and is driven to the mold-release position by the driving roller set. The workpiece implements mold release at the mold-release position.

In an embodiment of the invention, the imprinting method further includes clamping the flexible imprinting mold film through a clamping member, and lifting off the flexible imprinting mold film located at the mold-release position from the workpiece.

In an embodiment of the invention, the imprinting method further includes using at least one buffer member to lean against the flexible imprinting mold film to bend the flexible imprinting mold film, so as to form at least one buffer segment at a boundary of the imprinting segment located at the mold-release position.

In an embodiment of the invention, the imprinting method further includes following steps. When the imprinted workpiece is driven to the mold-release position by the driving roller set, another workpiece is conveyed to the imprinting position by the first conveyer unit. While the workpiece implements mold release at the mold-release position, the another workpiece is imprinted at the imprinting position.

In an embodiment of the invention, the number of the at least one mold-release position is two, and the imprinting position is located between the two mold-release positions, the imprinting segments include a first imprinting segment and a second imprinting segment adjacent to each other, the two mold-release positions include a first mold-release position and a second mold-release position, and the imprinting method further includes following steps. When the first imprinting segment and the second imprinting segment are located in the working region, the flexible imprinting mold film is driven by the driving roller set to perform a reciprocating motion between a first state and a second state, where when the flexible imprinting mold film is in the first state, the first imprinting segment is located at the first mold-release position and the second imprinting segment is located at the imprinting position, and when the flexible imprinting mold film is in the second state, the first imprinting segment is located at the imprinting position and the second imprinting segment is located at the second mold-release position.

In an embodiment of the invention, the imprinting segments further include a third imprinting segment and a fourth imprinting segment adjacent to each other, and the imprinting method further includes following steps. The flexible imprinting mold film is driven by the driving roller set to make the third imprinting segment and the fourth imprinting segment to be located in the working region. When the third imprinting segment and the fourth imprinting segment are located in the working region, the flexible imprinting mold film is driven by the driving roller set to perform the reciprocating motion.

In an embodiment of the invention, the imprinting method further includes detecting the imprinted workpiece through a second detection unit to determine a wearing status of the corresponding imprinting segment.

In an embodiment of the invention, the imprinting method further includes conveying the imprinted workpiece by a second conveyer unit to pass through the second detection unit.

According to the above descriptions, in the imprinting apparatus of the invention, the flexible imprinting mold film having a plurality of imprinting segments is taken as an imprinting mold, and when a part of the imprinting segments is used for imprinting the workpiece at the working region, another part of the imprinting segments is rolled around the driving roller set for preparation. Once the imprinting segment in use is required to be replaced due to wearing, the imprinting segments rolled around the driving roller set are driven by the driving roller set to enter the working region to replace the original imprinting segment. Under such configuration, the user is unnecessary to remove the original imprinting mold from the imprinting apparatus to install a new imprinting mold to the imprinting apparatus, instead, the driving roller set automatically replaces the imprinting segments of the flexible imprinting mold film, such that the imprinting apparatus is convenient in use.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
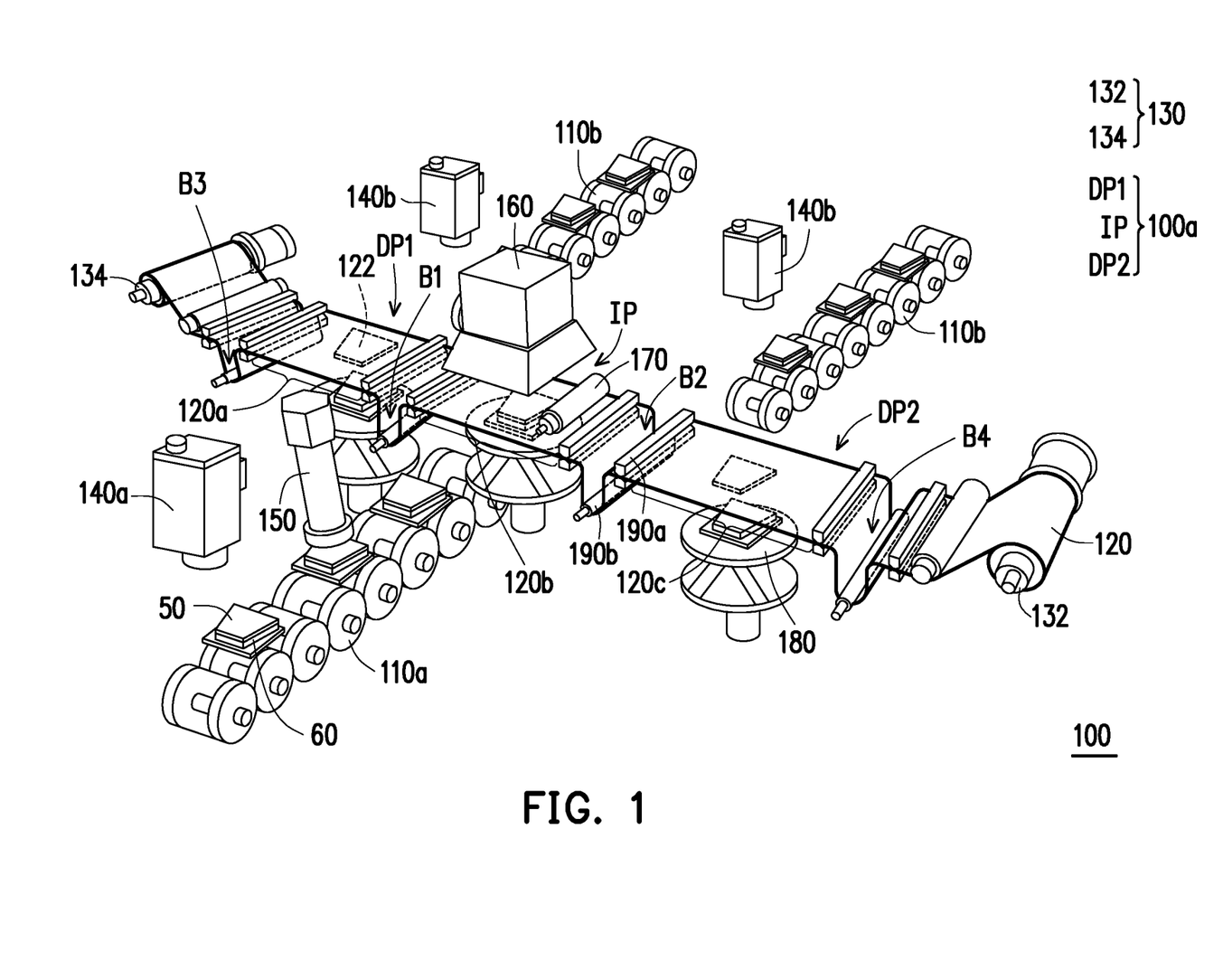
FIG. 1 is a three-dimensional view of a part of components of an imprinting apparatus according to an embodiment of the invention.

FIG. 1 is a three-dimensional view of a part of components of an imprinting apparatus according to an embodiment of the invention. Referring to FIG. 1, the imprinting apparatus 100 includes a first conveyer unit 110a, a flexible imprinting mold film 120 and a driving roller set 130. The first conveyer unit 110a is adapted to sequentially convey a plurality of workpieces 50 to a working region 100a of the imprinting apparatus 100. The flexible imprinting mold film 120 has a plurality of imprinting segments (a first imprinting segment 120a, a second imprinting segment 120b, a third imprinting segment 120c are indicated), and the first imprinting segment 120a, the second imprinting segment 120b and the third imprinting segment 120c are located in the working region 100a.

The flexible imprinting mold film 120 is, for example, ultra-thin glass or a plastic film with a thickness of 0.07-0.2 mm, and is partially rolled around the driving roller set 130. The first imprinting segment 120a, the second imprinting segment 120b and the third imprinting segment 120c located in the working region 100a are expanded from the driving roller set 130. The workpiece 50 is adapted to be imprinted in the working region 100a through the corresponding imprinting segment (the second imprinting segment 120b shown in FIG. 1). When the imprinting segment in the working region 100a is required to be replaced due to wearing, the driving roller set 130 may drive the flexible imprinting mold film 120, such that the other imprinting segments rolled around the driving roller set 130 can be expanded from the driving roller set 130 and moved to the working region 100a.

Namely, when a part of the imprinting segments of the flexible imprinting mold film 120 is used for imprinting the workpieces 50 in the working region 100a, the other part of the imprinting segments is rolled around the driving roller set 130 for preparation. Once the imprinting segment in use is required to be replaced due to wearing, the driving roller set 130 drives the imprinting segments rolled around the driving roller set 130 to enter the working region to replace the original imprinting segment. Under such configuration, the user is unnecessary to remove an original imprinting mold from the imprinting apparatus 100 to install a new imprinting mold to the imprinting apparatus 100, instead, the driving roller set 130 may automatically replace the imprinting segments of the flexible imprinting mold film 120, such that the imprinting apparatus 100 is convenient in use. Moreover, to use the ultra-thin glass as the flexible imprinting mold film 120, unexpected deformation of the flexible imprinting mold film 120 and the workpiece 50 thereon in the operation process can be avoided. An imprinting method of the imprinting apparatus of the embodiment is described below with reference of a figure.

Figure 2:
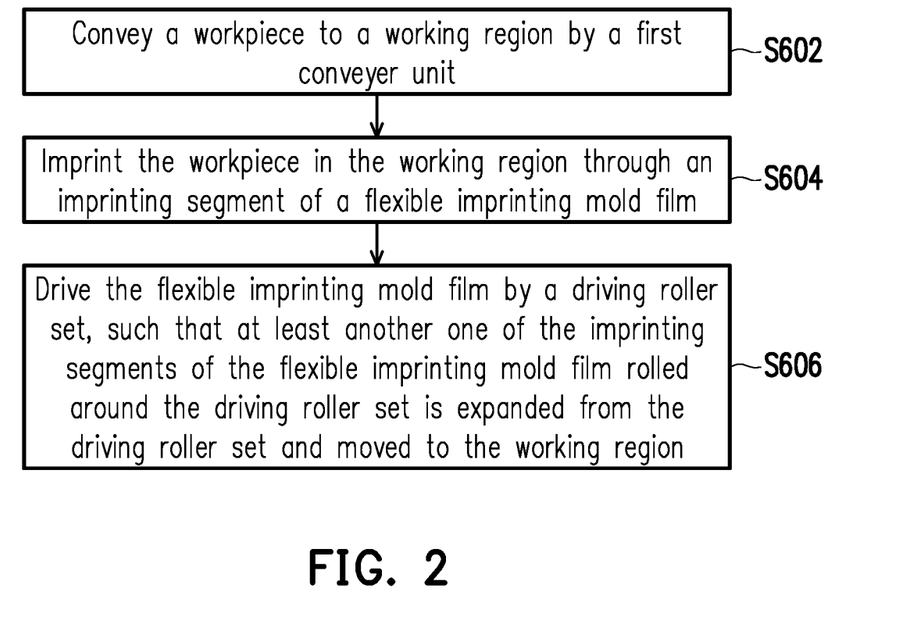
FIG. 2 is a flowchart illustrating an imprinting method according to an embodiment of the invention.

FIG. 2 is a flowchart illustrating an imprinting method according to an embodiment of the invention. Referring to FIG. 1 and FIG. 2, first, at least one workpiece 50 is conveyed to the working region 100a by the first conveyer unit 110a (step S602). Then, the workpiece 50 is imprinted in the working region 100a through an imprinting segment (for example, the second imprinting segment 120b shown in FIG. 1) of the flexible imprinting mold film 120 (step S604). The flexible imprinting mold film 120 is driven by the driving roller set 130, such that at least another one of the imprinting segments of the flexible imprinting mold film 120 rolled around the driving roller set 130 is expanded from the driving roller set 130 and moved to the working region 100a (step S606).

The imprinting apparatus 100 of the present embodiment is, for example, used for manufacturing optical elements having an optical grating, and related components of the imprinting apparatus 100 are described in detail below. As shown in FIG. 1, the imprinting apparatus 100 further includes a first detection unit 140a, an adhesive coating unit 150, an energy source 160, an imprinting mold roller 170, at least one second detection unit 140b (two second detection units are illustrated) and at least one second conveyer unit 110b (two second conveyer units are illustrated). The first detection unit 140a is, for example, an automated optical inspection (AOI) device and is disposed on a conveying path of the first conveyer unit 110a, the adhesive coating unit 150 is disposed between the first detection unit 140a and the working region 100a, the energy source 160 and the imprinting mold roller 170 are disposed in the working region 100a, and the second detection units 140b are, for example, AOI devices and are disposed on conveying paths of the second conveyer units 110b.

Each of the workpieces 50 is, for example, a glass substrate or a plastic substrate, and the adhesive coating unit 150 is adapted to coat an optical layer (not shown) on the workpiece 50 before the workpiece 50 reaches the working region 100a. The adhesive coating unit 150 is, for example, an inject printing device to save the amount of material used in the adhesive coating operation. Each of the imprinting segments of the flexible imprinting mold film 120 has an imprinting microstructure 122, and the imprinting mold roller 170 is adapted to press the corresponding imprinting segment (the second imprinting segment 120b in the working region 100a shown in FIG. 1) to the workpiece 50, such that the imprinting microstructure 122 of the second imprinting segment 120b imprint the optical layer to form an optical microstructure (for example, an optical grating) on the workpiece 50. The first detection unit 140a is adapted to detect a surface state of the workpiece 50 uncoated with the optical layer, so as to ensure that the surface of the workpiece 50 has no dirt and particles before being coated with the optical layer.

The imprinted optical layer is adapted to be cured through energy provided by the energy source 160. For example, the optical layer is, for example, a UV adhesive, and the energy source 160 is, for example, a UV light source, such that a UV light can be used to cure the optical layer. In other embodiments, the optical layer can be other types of adhesive layers (for example, an adhesive layer with two-stage characteristic), and a first energy source disposed between the adhesive coating unit 150 and the working region 100a and a second energy source disposed in the working region 100a are adopted to replace the energy source 160 of FIG. 1, where the optical layer before imprinted can be first half-cured through the energy provided by the first energy source, and the imprinted optical layer can be completely cured through the energy provided by the second energy source.

The second conveyer unit 110b is adapted to convey the imprinted workpiece 50 to pass through the second detection unit 140b. The second detection unit 140b is adapted to detect the imprinted workpiece 50 to determine a wearing status of the corresponding imprinting segment. If it is learned that the corresponding imprinting segment has been worn to an extent that requires a replacement after the second detection unit 140b detects the workpiece 50, as described above, the driving roller set 130 may automatically replace the imprinting segment of the flexible imprinting mold film 120.

In the present embodiment, the driving roller set 130 includes two driving rollers 132 and 134, the working region 100a is located between the driving roller 132 and the driving roller 134, and the flexible imprinting mold film 120 is partially rolled around the driving roller 132 and is partially rolled around the driving roller 134. The driving rollers 132 and 134 are adapted to rotate to drive the flexible imprinting mold film 120 to move. Moreover, in the present embodiment, a carrier member 60 is adopted to carry the workpiece 50, and the carrier member 60 is conveyed on the first conveyer unit 110a or the second conveyer unit 110b to accordingly move the workpiece 50. Moreover, the carrier member 60, for example, provides a suction force to suck the workpiece 50 thereon, so as to avoid the workpiece 50 detaching from the carrier member 60 during the conveying or imprinting process.

Configuration of the working region 100a of the present embodiment is described below. Referring to FIG. 1, the working region 100a of the present embodiment includes an imprinting position IP and at least one mold-release position (a first mold-release position DP1 and a second mold-release position DP2 are illustrated). The imprinting position IP is located between the first mold-release position DP1 and the second mold-release position DP2, and the imprinting mold roller 170 and the energy source 160 are disposed at the imprinting position IP, and the first imprinting segment 120a, the second imprinting segment 120b and the third imprinting segment 120c are respectively located at the first mold-release position DP1, the imprinting position IP and the second mold-release position DP2, as shown in FIG. 1. The workpiece 50 is adapted to be imprinted at the imprinting position IP, and the imprinted workpiece 50 is adhered to the corresponding imprinting segment, and is driven by the driving roller set 130 to move to the first mold-release position DP1 or the second mold-release position DP2, and the workpiece 50 is adapted to implement mold release at the first mold-release position DP1 or the second mold-release position DP2.

Further, when the imprinted workpiece 50 is driven by the driving roller set 130 to move from the imprinting position IP to the first mold-release position DP1 or the second mold-release position DP2, the first conveyer unit 110a conveys another workpiece 50 to the imprinting position IP, and while the imprinted workpiece 50 implements the film release at the first mold-release position DP1 or the second mold-release position DP2, the other workpiece 50 is imprinted at the imprinting position IP, such that working efficiency of the imprinting apparatus 100 is improved.

Figure 3:
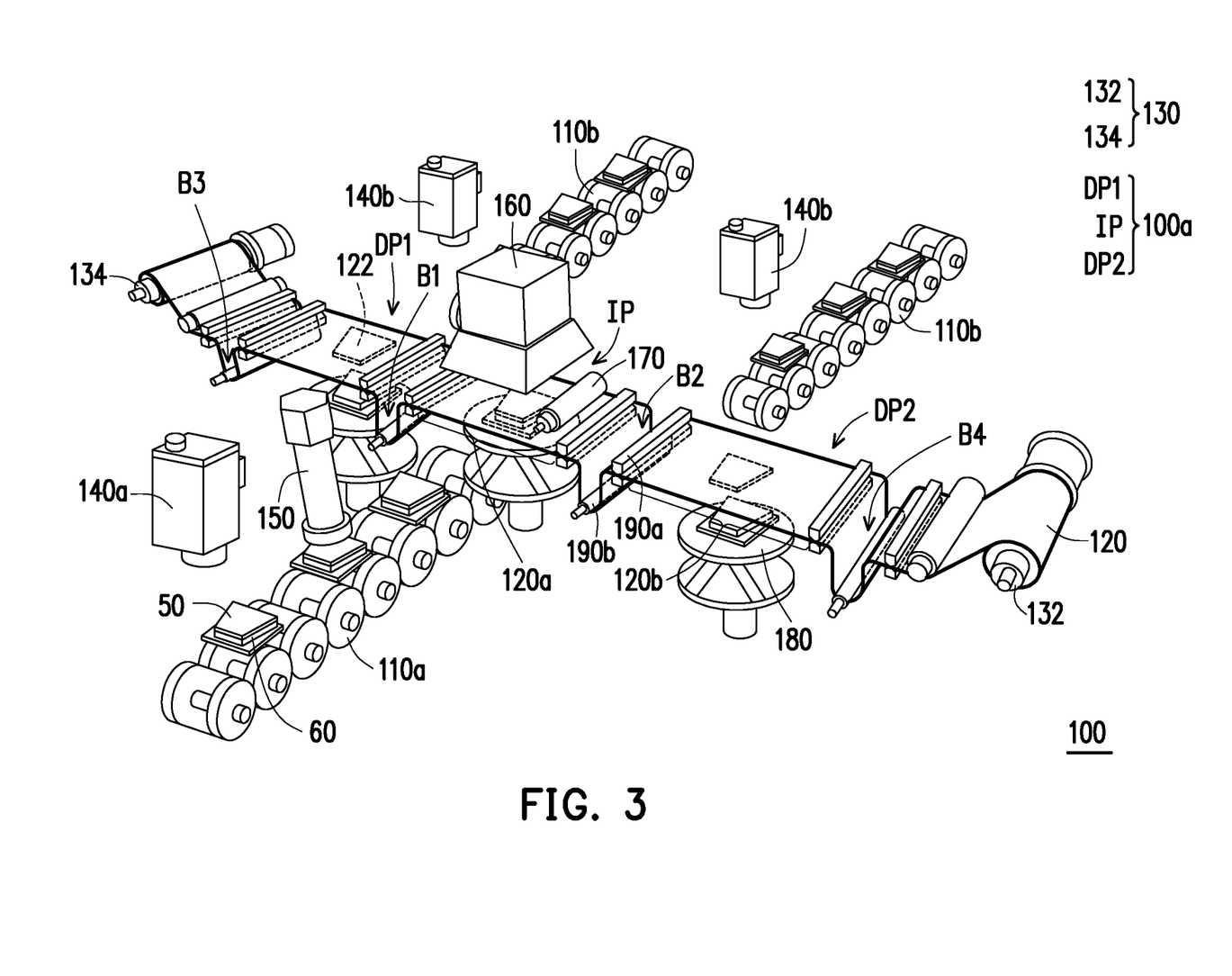
FIG. 3 is a schematic diagram of a flexible imprinting mold film of FIG. 1 operated from a first state to a second state.

FIG. 3 is a schematic diagram of the flexible imprinting mold film of FIG. 1 operated from a first state to a second state. In the present embodiment, when the first imprinting segment 120a and the second imprinting segment 120b are located in the working region 100a, the driving roller set 130 is adapted to drive the flexible imprinting mold film 120 to perform a reciprocating motion between a first state shown in FIG. 1 and a second state shown in FIG. 3. When the flexible imprinting mold film 120 is in the first state as shown in FIG. 1, the first imprinting segment 120a is located at the first mold-release position DP1 and the second imprinting segment 120b is located at the imprinting position IP, and now the workpiece 50 corresponding to the first imprinting segment 120a may implement mold release at the first mold-release position DP1, and the workpiece 50 corresponding to the second imprinting segment 120b is imprinted at the imprinting position IP. When the flexible imprinting mold film 120 is in the second state as shown in FIG. 3, the first imprinting segment 120a is located at the imprinting position IP and the second imprinting segment 120b is located at the second mold-release position DP2, and now the workpiece 50 corresponding to the first imprinting segment 120a is imprinted at the imprinting position IP, and the workpiece 50 corresponding to the second imprinting segment 120b may implement mold release at the second mold-release position DP2. Based on the aforementioned reciprocating motion of the flexible imprinting mold film 120, the first imprinting segment 120a and the second imprinting segment 120b of the flexible imprinting mold film 120 can be repeatedly used to perform the imprinting operation.

Figure 4:
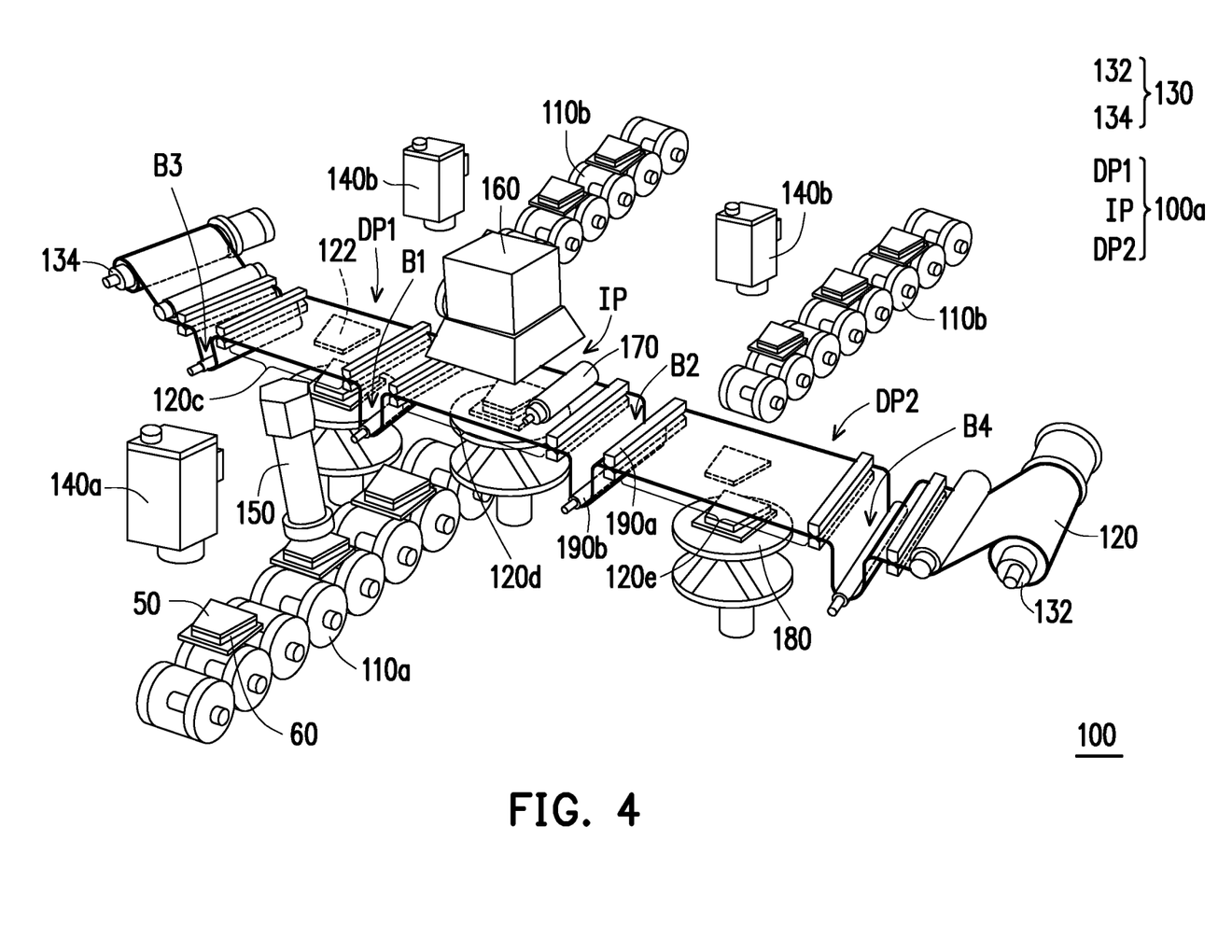
FIG. 4 is a schematic diagram of a flexible imprinting mold film of FIG. 1 with replaced imprinting segments.

FIG. 4 is a schematic diagram of the flexible imprinting mold film of FIG. 1 with replaced imprinting segments. When the first imprinting segment 120a and the second imprinting segment 120b of the flexible imprinting mold film 120 are gradually worn out and required to be replaced, the driving roller set 130 may drive the flexible imprinting mold film 120 to make a third imprinting segment 120c, a fourth imprinting segment 120d, a fifth imprinting segment 120e to be located in the working region 100a as shown in FIG. 4. When the third imprinting segment 120c, the fourth imprinting segment 120d and the fifth imprinting segment 120e are located in the working region 100a, the driving roller set 130 is adapted to drive the flexible imprinting mold film 120 to perform the reciprocating motion, so as to repeatedly use the third imprinting segment 120c and the fourth imprinting segment 120d of the flexible imprinting mold film 120 to perform the imprinting operation. In this way, the driving roller set 130 may drive the flexible imprinting mold film 120 to automatically replace the imprinting segments.

The imprinting apparatus 100 of the present embodiment further includes at least one lifting unit 180 (three lifting units are illustrated). The lifting units 180 are disposed in the working region 100a and respectively aligned to the first mold-release position DP1, the imprinting position IP and the second mold-release position DP2, and each of the lifting units 180 is adapted to drive the corresponding carrier member 60 and workpiece 50 to move up and down relative to the flexible imprinting mold film 120, such that the workpiece 50 may smoothly implement imprinting and mold release.

Moreover, the imprinting apparatus 100 of the present embodiment further includes at least one clamping member 190a (a plurality of clamping members is illustrated) and at least one buffer member 190b (a plurality of buffer members is illustrated). The clamping members 190a are disposed in the working region 100a, and the buffer members 190b are disposed between the imprinting position IP and the first mold-release position DP1 and between the imprinting position IP and the second mold-release position DP2. The clamping members 190a are adapted to clamp the flexible imprinting mold film 120 at boundaries of the first mold-release position DP1, the imprinting position IP and the second mold-release position DP2 as shown in FIG. 1. Therefore, when the buffer members lean against the flexible imprinting mold film 120 to bend the flexible imprinting mold film 120, buffer segments B1 and B3 can be formed at the boundary of the first imprinting segment 120a located at the first mold-release position DP1, and buffer segments B2 and B4 can be formed at the boundary of the third imprinting segment 120c located at the second mold-release position DP2. A part of the clamping members 190a may lift off the flexible imprinting film 120 located at the first mold-release position DP1 and the second mold-release position DP2 from the workpieces 50, such that the imprinted workpieces 50 can be conveyed to the second detection units 140b by the second conveyer units 110b. During the process of lifting the flexible imprinting mold film 120 off the workpieces 50, based on the buffer effect provided by the buffer segments B1, B2, B3 and B4, the mold-release operations of the imprinting segments of the flexible imprinting mold film 120 performed at the first mold-release position DP1 and the second mold-release position DP2 are avoided to disturb the other imprinting segments of the flexible imprinting mold film 120, such that the imprinting operation can be smoothly performed.

Figure 5A:
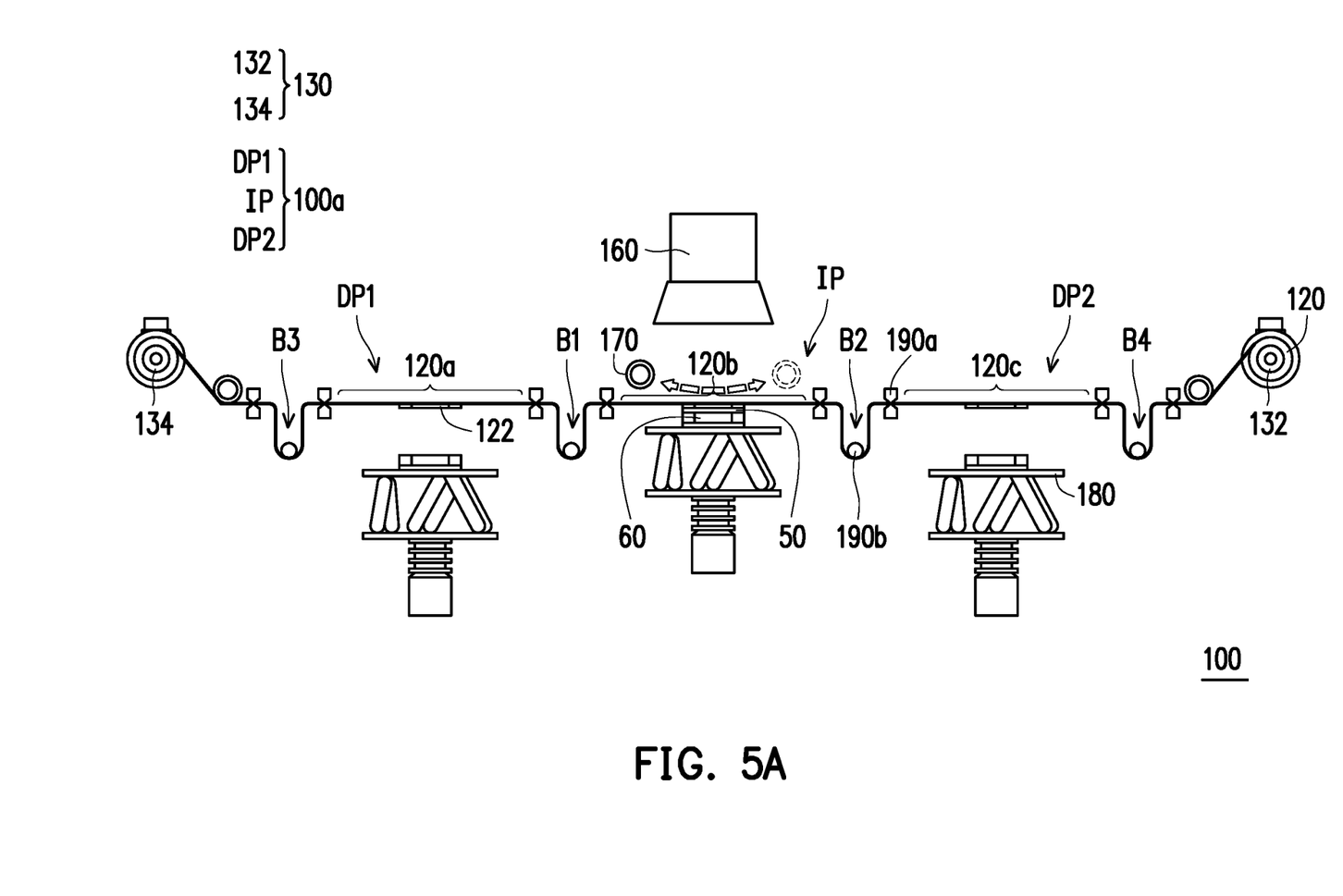
FIG. 5A to FIG. 5G are operation flows of the imprinting apparatus of FIG. 1.
Figure 5B:
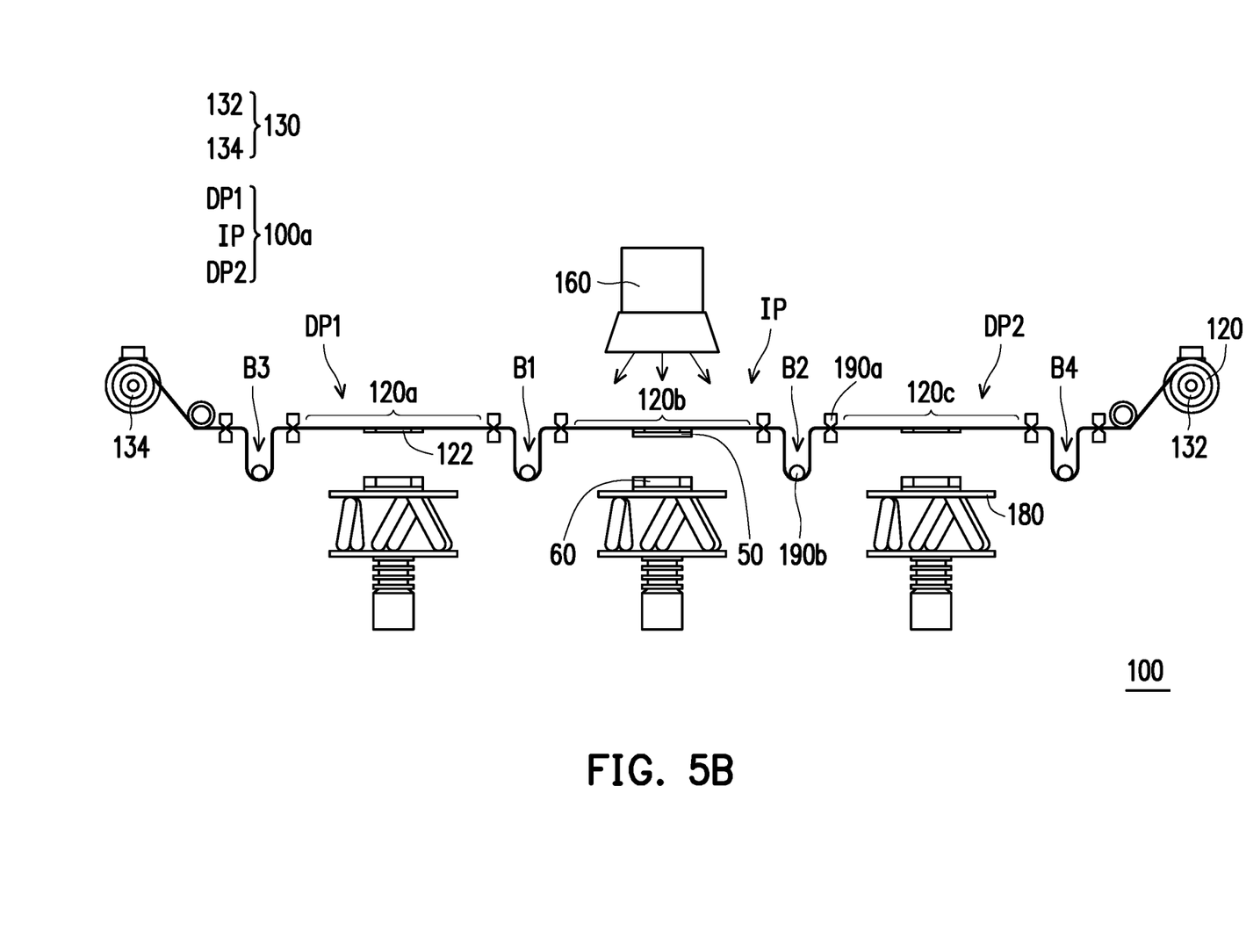

Detailed operation methods and operation flows of various components of the imprinting apparatus 100 of the present embodiment are describe below with reference of figures. FIG. 5A to FIG. 5G are operation flows of the imprinting apparatus of FIG. 1. First, as shown in FIG. 5A, the lifting unit 180 lifts the corresponding carrier member 60 and workpiece 50 at the imprinting position IP, and the imprinting mold roller 170 rolls on the second imprinting segment 120b to imprint the corresponding workpiece 50, and the energy source 160 provides energy to cure the imprinted optical layer on the workpiece 50. Then, as shown in FIG. 5B, the lifting unit 180 descents the corresponding carrier member 60 at the imprinting position IP, and now the workpiece 50 is adhered on the corresponding imprinting microstructure 122. In FIG. 5A and FIG. 5B, the flexible imprinting mold film 120 is in the first state, i.e. the first imprinting segment 120a is located at the first mold-release position DP1, and the second imprinting segment 120 is located at the imprinting position IP.

Figure 5C:
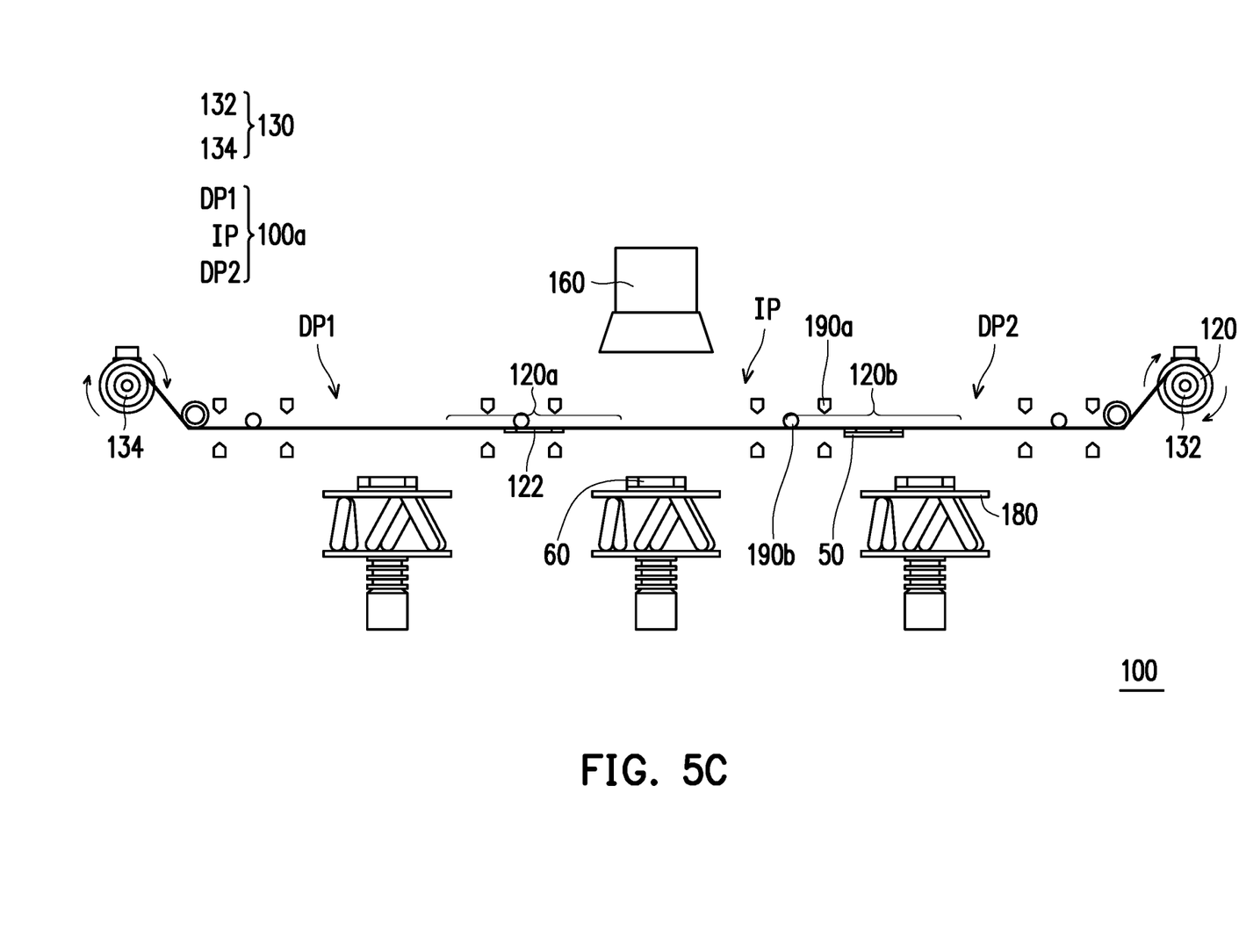

As shown in FIG. 5C, the clamping members 190a and the buffer members 190b release the flexible imprinting mold film 120, and the driving rollers 132 and 134 rotate clockwise to right-shift the first imprinting segment 120a and the second imprinting segment 120b.

Figure 5D:
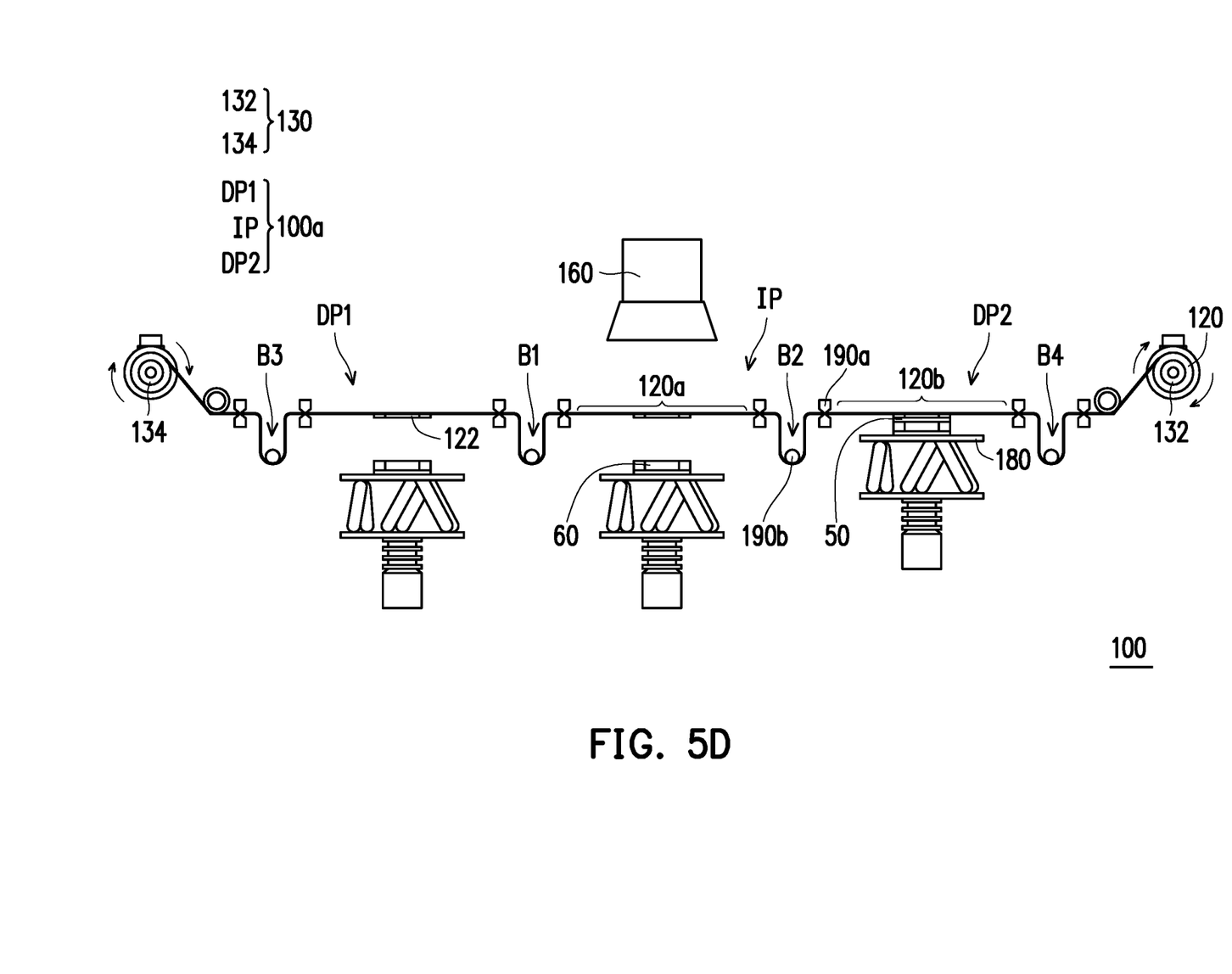
Figure 5E:
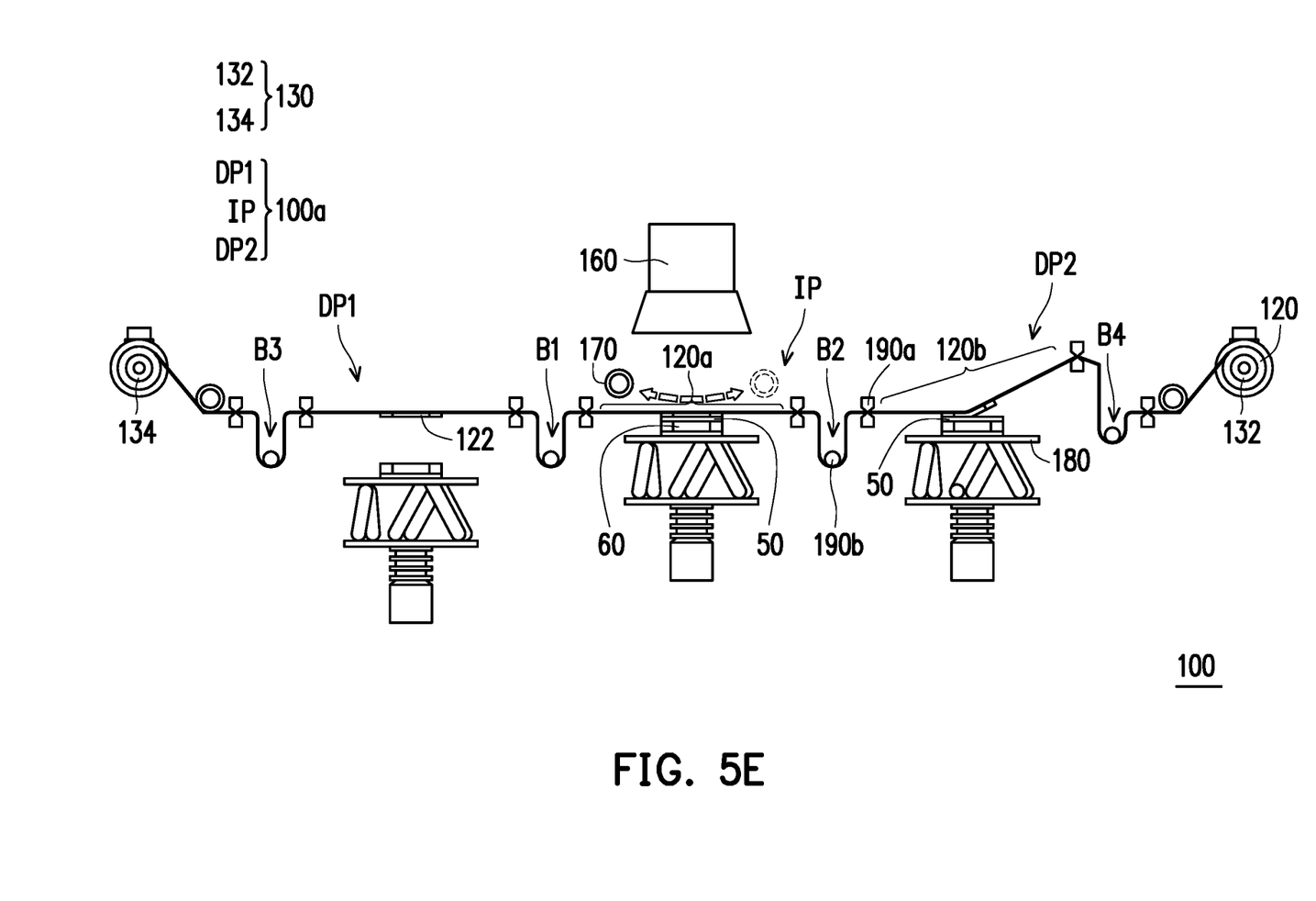
Figure 5F:
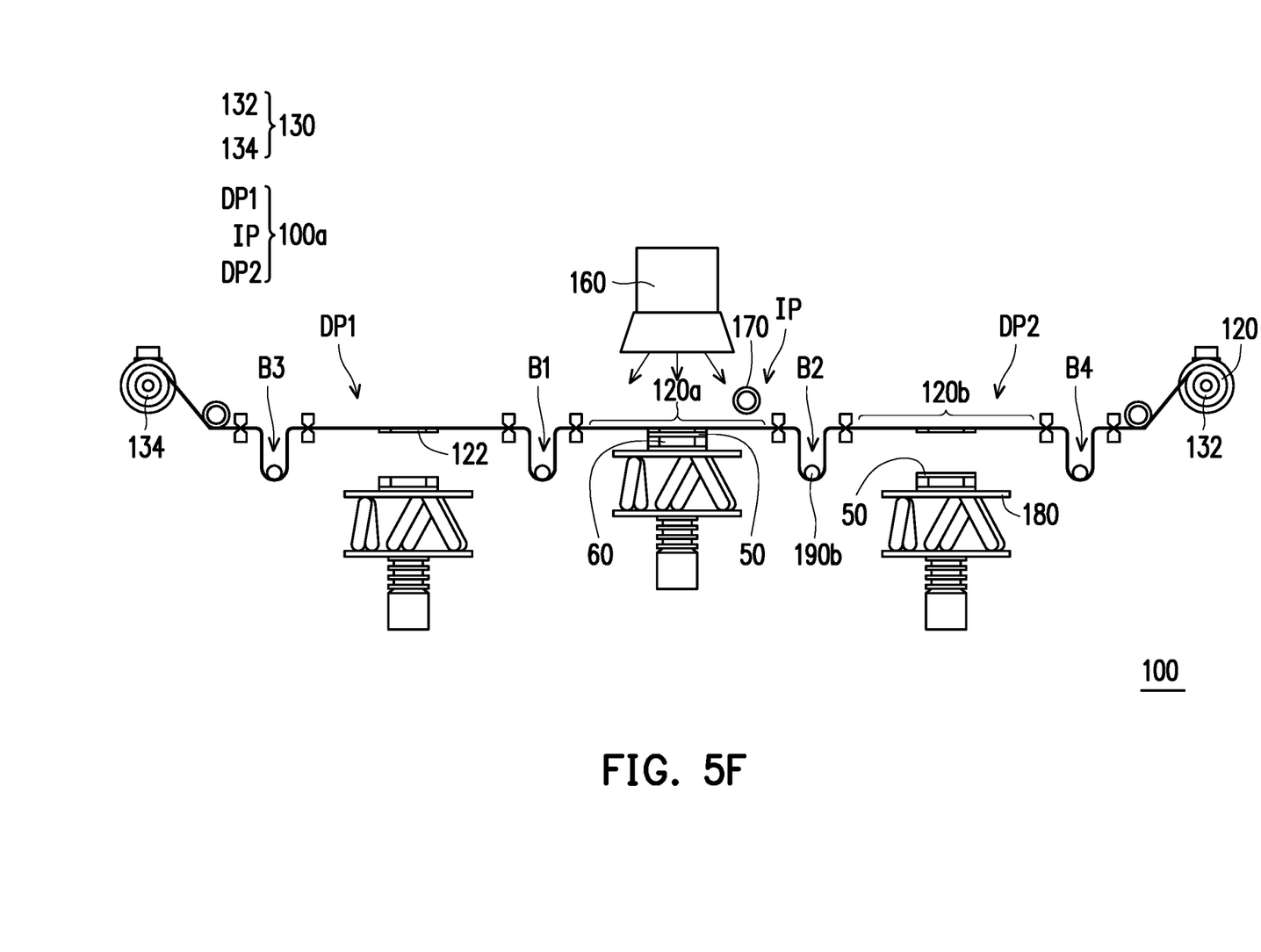

As shown in FIG. 5D, the clamping members 190a clamp the flexible imprinting mold film 120, the buffer members 190b lean against the flexible imprinting mold film 120, and the driving roller 134 rotates clockwise, such that the first imprinting segment 120a is aligned to the imprinting position IP, and the second imprinting segment 120b and the workpiece 50 adhered thereon are aligned to the second mold-release position DP2. Now, the lifting unit 180 lifts the corresponding carrier member 60 at the second mold-release position DP2 to carry the corresponding workpiece 50. As shown in FIG. 5E, the lifting unit 180 lifts another corresponding carrier member 60 and another workpiece 50 at the imprinting position IP, and the imprinting mold roller 170 rolls on the second imprinting segment 120a to imprint the corresponding workpiece. Meanwhile, the clamping member 190a lifts off the flexible imprinting mold film 120 located at the second mold-release position DP2 from the corresponding workpiece 50. As shown in FIG. 5F, the energy source 160 provides energy to cure the imprinted optical layer on the workpiece 50, and the lifting unit 180 descents the corresponding carrier member 60 and workpiece 50 at the second mold-release position DP2. In FIG. 5D, FIG. 5E and FIG. 5F, the flexible imprinting mold film 120 is in the second state, i.e. the first imprinting segment 120a is located at the imprinting position IP, and the second imprinting segment 120b is located at the second mold-release position DP2.

Figure 5G:
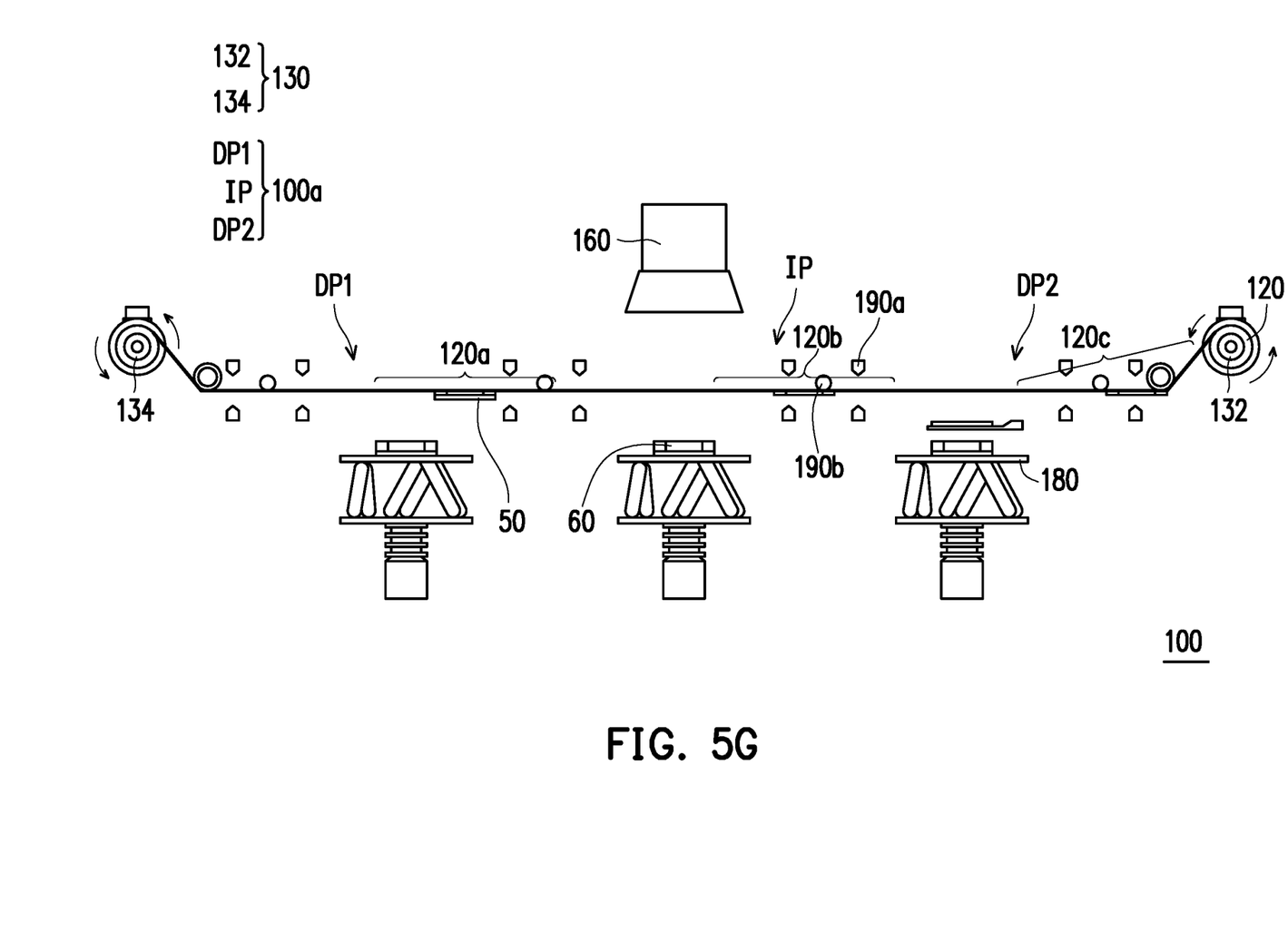

As shown in FIG. 5G, the workpiece 50 located at the second mold-release position DP2 is removed from the carrier member 60, and the workpiece 50 is conveyed to the second detection unit 140b shown in FIG. 1 for detection. Moreover, the clamping members 190 and the buffer members 190b release the flexible imprinting mold film 120 as shown in FIG. 5G, and the driving rollers 132 and 134 rotate anticlockwise to left-shift the first imprinting segment 120a and the second imprinting segment 120b, such that the flexible imprinting mold film 120 is again driven to the first state, and the similar imprinting and film release operations are continually performed at the first mold-release position DP1 and the imprinting position IP.

In summary, in the imprinting method of the invention, the flexible imprinting mold film having a plurality of imprinting segments is taken as an imprinting mold, and when a part of the imprinting segments is used for imprinting the workpiece at the working region, another part of the imprinting segments is rolled around the driving roller set for preparation. Once the imprinting segment in use is required to be replaced due to wearing, the imprinting segments rolled around the driving roller set are driven by the driving roller set to enter the working region to replace the original imprinting segment. Under such configuration, the user is unnecessary to remove the original imprinting mold from the imprinting apparatus to install a new imprinting mold to the imprinting apparatus, instead, the driving roller set automatically replaces the imprinting segments of the flexible imprinting mold film, such that the imprinting apparatus is convenient in use. Moreover, to use the ultra-thin glass as the flexible imprinting mold film, unexpected deformation of the flexible imprinting mold film and the workpiece thereon in the operation process can be avoided. In addition, when the imprinted workpiece implements the mold release at the mold-release position, another workpiece can be imprinted at the imprinting position at the same time, so as to improve the working efficiency of the imprinting apparatus. Moreover, through the buffer segments formed by the buffer members on the flexible imprinting mold film, the mold-release operations of the imprinting segments of the flexible imprinting mold film performed at the mold-release positions are avoided to disturb the other imprinting segments of the flexible imprinting mold film, such that the imprinting operation can be smoothly performed.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An imprinting method, comprising:
conveying a workpiece to a working region by a first conveyer unit;
imprinting the workpiece in the working region through an imprinting segment of a flexible imprinting mold film; and
driving the flexible imprinting mold film by a driving roller set, such that at least another one of the imprinting segments of the flexible imprinting mold film rolled around the driving roller set is expanded from the driving roller set and moved to the working region,
wherein the working region comprises an imprinting position and at least one mold-release position, the number of the at least one mold-release position is two, the imprinting position is located between the two mold-release positions, the imprinting segments comprise a first imprinting segment and a second imprinting segment adjacent to each other, the two mold-release positions comprise a first mold-release position and a second mold-release position, and the imprinting method further comprises:
making at least two of the imprinting segments to be respectively located at the imprinting position and the at least one mold-release position;
imprinting the workpiece at the imprinting position;
adhering the imprinted workpiece to the corresponding imprinting segment and driving the imprinted workpiece to the at least one mold-release position by the driving roller set;
implementing mold release to the workpiece at the at least one mold-release position; and
driving the flexible imprinting mold film by the driving roller set to perform a reciprocating motion between a first state and a second state when the first imprinting segment and the second imprinting segment are located in the working region,
wherein when the flexible imprinting mold film is in the first state, the first imprinting segment is located at the first mold-release position and the second imprinting segment is located at the imprinting position, and when the flexible imprinting mold film is in the second state, the first imprinting segment is located at the imprinting position and the second imprinting segment is located at the second mold-release position.

2. The imprinting method as claimed in claim 1, further comprising:
coating an optical layer on the workpiece by an coating unit before the workpiece reaches the working region,
wherein the step of imprinting the workpiece through the imprinting segment comprises:
imprinting the optical layer through an imprinting microstructure of the imprinting segment to form an optical microstructure on the workpiece.

3. The imprinting method as claimed in claim 2, further comprising:
detecting a surface state of the workpiece uncoated with the optical layer through a first detection unit.

4. The imprinting method as claimed in claim 2, further comprising:
curing the imprinted optical layer through energy provided by an energy source.

5. The imprinting method as claimed in claim 2, further comprising:
half-curing the optical layer before imprinted through energy provided by a first energy source; and
completely curing the imprinted optical layer through energy provided by a second energy source.

6. The imprinting method as claimed in claim 1, further comprising:
pressing the corresponding imprinting segment to the workpiece through an imprinting mold roller.

7. The imprinting method as claimed in claim 1, further comprising:
driving the workpiece to move up and down relative to the flexible imprinting mold film through a lifting unit.

8. The imprinting method as claimed in claim 1, further comprising:
clamping the flexible imprinting mold film through a clamping member, and lifting off the flexible imprinting mold film located at the at least one mold-release position from the workpiece.

9. The imprinting method as claimed in claim 1, further comprising:
using at least one buffer member to lean against the flexible imprinting mold film to bend the flexible imprinting mold film, so as to form at least one buffer segment at a boundary of the imprinting segment located at the at least one mold-release position.

10. The imprinting method as claimed in claim 1, further comprising:
conveying another workpiece to the imprinting position by the first conveyer unit when the imprinted workpiece is driven to the at least one mold-release position by the driving roller set; and imprinting the another workpiece at the imprinting position while the workpiece implements mold release at the at least one mold-release position.

11. The imprinting method as claimed in claim 1, wherein the imprinting segments further comprise a third imprinting segment and a fourth imprinting segment adjacent to each other, and the imprinting method further comprises:

driving the flexible imprinting mold film by the driving roller set to make the third imprinting segment and the fourth imprinting segment to be located in the working region; and driving the flexible imprinting mold film by the driving roller set to perform the reciprocating motion when the third imprinting segment and the fourth imprinting segment are located in the working region.

12. The imprinting method as claimed in claim 1, further comprising:

detecting the imprinted workpiece through a second detection unit to determine a wearing status of the corresponding imprinting segment.

13. The imprinting method as claimed in claim 12, further comprising:

conveying the imprinted workpiece by a second conveyer unit to pass through the second detection unit.

\* \* \* \* \*